United States Patent [19]

Maerz et al.

[11] Patent Number: 4,670,093

[45] Date of Patent: Jun. 2, 1987

[54] METHOD FOR MANUFACTURING A SURFACE GRATING OF A DEFINED GRATING CONSTANT ON REGIONS OF A MESA STRUCTURE

[75] Inventors: Reinhard Maerz; Gerhard Heise, both of Munich, Fed. Rep. of Germany

[73] Assignee: Siemens Aktiengesellschaft, Berlin and Munich, Fed. Rep. of Germany

[21] Appl. No.: 853,946

[22] Filed: Apr. 21, 1986

Foreign Application Priority Data

Apr. 19, 1985 [DE] Fed. Rep. of Germany ........ 3514301
Mar. 26, 1986 [DE] Fed. Rep. of Germany ........ 3610333

[51] Int. Cl.⁴ ..................... H01L 21/306; B44C 1/22
[52] U.S. Cl. ......................... 156/649; 29/569 L; 156/651; 156/659.1; 156/662; 252/79.1; 252/79.2; 372/44
[58] Field of Search ............ 156/649, 651, 659.1, 156/661.1, 662, 647; 252/79.1, 79.2; 29/569 L; 357/17, 55, 56; 372/44, 46, 48

[56] References Cited

U.S. PATENT DOCUMENTS 4,405,405 9/1983 Fujii et al. ..................... 156/633

FOREIGN PATENT DOCUMENTS 3437209 10/1984 Fed. Rep. of Germany .
0148880 11/1981 Japan ............................. 156/649

*Primary Examiner*—William A. Powell
*Attorney, Agent, or Firm*—Hill, Van Santen, Steadman & Simpson

[57] ABSTRACT

A method for manufacturing a surface grating on a mesa structure of a laser includes etching a substrate surface by wet-chemical etching to form a surface grating of defined grating constant, masking regions of the surface grating corresponding to the mesa structure, and further etching the unmasked regions to transfer the surface grating to the more deeply situated surface regions of the mesa structure while retaining substantially the same grating constant.

6 Claims, 2 Drawing Figures

METHOD FOR MANUFACTURING A SURFACE GRATING OF A DEFINED GRATING CONSTANT ON REGIONS OF A MESA STRUCTURE

BACKGROUND OF THE INVENTION

1. Field of the Invention

The present invention relates generally to a method for manufacturing surface gratings on lasers having a stepped or mesa structure.

2. Description of the Prior Art

A distributed feedback-metal cladded ridge waveguide laser (DFB-MCRW laser) is disclosed in U.S. patent application Ser. No. 785,228 filed on Oct. 7, 1985. The strip waveguide laser includes a grating structure formed by single step epitaxy along the strip, or ridge, and along the lateral regions on either side thereof as well. It is necessary in order to realize a DFB-MCRW laser in single step epitaxy to produce gratings in the more deeply situated regions immediately adjacent the elevated region of the mesa structure. It is possible to produce such surface gratings in the more deeply situated regions by using methods of multi-layer masking. However, problems arise in that the photo-resist cannot be whirled into substrates having mesa structures.

SUMMARY OF THE INVENTION

It is an object of the present invention to provide a simple and extremely inexpensive method to produce surface gratings of a defined grating constant on the more deeply situated regions of a stepped structure laser. These and other objects of the present invention are embodied in a manufacturing method wherein a finely structured surface in the form of a surface grating having a defined grating constant is etched into a substrate surface by an anisotropic etchant which etches slowest in at least one direction oblique to the surface. The relief, or three-dimensional structure, of the surface grating is masked at a portion corresponding to the mesa portion and a remaining mask-free region is exposured to the anisotropic etchant so that more deeply situated surface regions of the stepped structure are formed. The relief of the surface grating is transferred into the more deeply situated portions more or less true-to-shape while retaining the defined grating constant. The desired surface grating is, thus, formed on the lower regions of the step laser structure at the conclusion of the etching process.

The present method is self-adjusting in that the surface grating of the upper surface of the substrate need only coincide with the grating constant on the more deeply situated surface regions. Otherwise, the profile of the grooves of the surface grating can have an arbitrary shape. It is possible for this grating, for example, to be slightly rippled or, to have a rectangular groove profile.

A particular advantage of the present method is that essentially the same anisotropic etchant as is used in wet-chemical etching of the upper substrate surface may also be used to etch the stepped structure. The substrate surface is etched initially with a surface grating having the same groove profile as that of the desired final surface grating. The initial surface grating is transferred essentially unaltered to the lower portions as the lower portions are etched so that there is extremely good reproduction of the grating at the more deeply situated regions.

In the present method, the regions of the structured surface which are to remain as elevated regions are covered by a mask and are thereby separated from the more deeply situated regions by a step transition, or stepped structure. The same phase relationship remains between the surface grating of the upper surface and the surface grating of the lower surfaces. The mask over the upper surface lies tightly thereagainst so that none of the etchant can penetrate laterally thereunder. In the case of MCRW lasers where the elevated region is strip-shaped, the surface grating of the elevated regions is used for gain coupling since a modulation of the injection current occurs by the three-dimensionally changing transition resistance.

DESCRIPTION OF THE PREFERRED EMBODIMENTS

Figure 1:
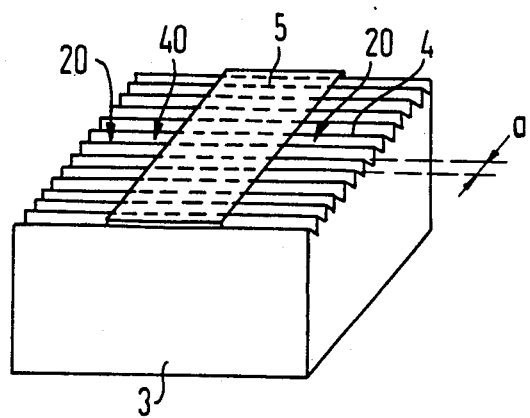
FIG. 1 is a perspective view of a substrate having a finely structured surface grating, a portion of which is covered by a strip-shaped etching mask.

Although the present invention can be utilized to form complex stepped structures, for the sake of simplicity, a relatively simple stepped structure in the form of an MCRW laser having a single strip-shaped elevated region is disclosed. The MCRW laser, as shown in FIG. 1, has a finely structured surface 40 including a surface grating 4 formed of grooves with a V-shaped profile etched into the surface of a wafer 3. The wafer 3 preferably includes an epitaxial layer system (not shown) which has been wet-chemically etched with an anisotropic etchant to expose the (III) -faces of the crystal material of the substrate. The surface grating 4 extends over the entire surface 40 and has a generally uniform grating constant a. A photoresist which is exposed by means of an interference pattern is used as the mask to form the surface grating 4.

Photoresist is again applied to the surface grating 4 tightly adjacent to the relief of the grating. A photoresist strip 5 is formed by mask exposure so that its longitudinal direction proceeds transversely, and preferably perpendicularly, to the grooves of the surface grating 4. The remaining regions 20 of the surface gratings 4 which adjoin the long sides of the photoresist strip are entirely exposed so that the etchant has unimpeded contact with these regions 20 during production of a stepped structure.

Figure 2:
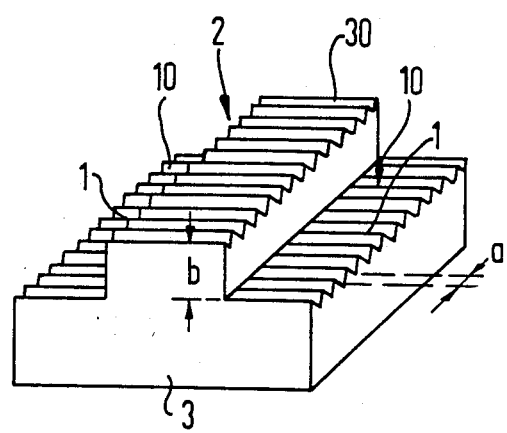
FIG. 2 shows the structure of FIG. 1 after etching.

As shown in FIG. 2, the stepped structure 2 includes a stripped shaped elevated region 30 over which the mask strip 5 had been formed. The exposed surfaces of the grating 4 are preferably etched with the same etchant as in the manufacture of the original surface grating 4 and, as a result thereof, this same grating 4 is transferred into the depths of the regions 20 laterally adjacent the photoresist strip 5 in unmodified form. Thus, more deeply situated surface regions 10 having the desired surface grating 1 are formed adjoining the intervening stripped shaped elevated region 30 on which the original surface grating 4 has remained. The upper surface gratings 4 and the newly formed gratings 1 on the more deeply situated regions 10 have the same phase relationship and the same grating constant a.

In one embodiment of the present method, the stepped structure 2 is formed by a substrate 3 composed of III-V semiconductor etched with an etchant composed of a mixture of sulfuric acid, hydrogen peroxide and water. For a realization of a structure 2 a substrate 3 composed of GaAs or GaAlAs was etched by an etchant composed of 0.75 to three parts of sulfuric acid (conc.), 8 parts of 30% hydrogen peroxide, and 35 parts of water. The percentages refer to per cent by volume. For example, the etchant may be composed of three parts of 25% sulfuric acid by volume, 8 parts of 30% hydrogen peroxide, and 35 parts of water.

Using the above materials, the manufacture of the surface grating 4 proceeds as follows: the surface of the substrate is etched for approximately 1 minute, and to form the stepped structure 2, etching is carried out for approximately 1–5 minutes to produce a sink-in depth b of between 0.2 and 1.4 μm. In the example, the grating constant a is in the sub-micron range and is approximately equal to 0.3 μm. The etching process is preferably undertaken at low temperatures, for example at or near 0° C.

By preference the stepped structure 2 is formed on a substrate 3 composed of InP or of a quaternary material based on InP, for example InGaAsP. The etchant is in contrast to the above mentioned one a mixture composed of 10 parts of hydrogen bromide (HBr), one part of saturated brom water (SBW) and 40 parts of water. The percentages refer again to per cent by volume. This etchant with the given or a similar mixture ratio produces gratings with a v-shaped profile, which is transferred in the above mentioned way using the same etchant.

As is apparent from the foregoing specification, the invention is susceptible to being embodied with various alterations and modifications which may differ particularly from those that we have described in the preceeding specification and description. It should be understood that we wish to embody within the scope of the patent granted hereon all such modifications as reasonably and properly come within our contribution to the art.

I claim as my invention:

1. A method for manufacturing a surface grating of a defined grating constant on a stepped structure, comprising the steps of:
   (a) etching a crystalline substrate surface with a surface grating of a defined surface constant by a wet-chemical anisotropic etchant, said etching proceeding more slowly in at least one direction oblique to said substrate surface;
   (b) masking a region of said surface grating to define unmasked regions; and
   (c) further etching said unmasked regions by an anisotropic etchant to produce more deeply situated regions of said stepped structure, said more deeply situated regions retaining said defined grating constant.

2. A method as claimed in claim 1, wherein a mesa structure is formed.

3. A method as claimed in claim 1, wherein substantially the same anisotropic etchant is used in both steps a and c.

4. A method as claimed in claim 1, wherein a distributed feedback-metal cladded ridge waveguide laser is formed.

5. A method as claimed in claim 1, wherein the substrate is composed of InP and the etchant is a mixture composed of HBr, saturated Brom water (SBW) and water.

6. A method as claimed in claim 1, wherein the substrate is composed of GaAs and the etchant is a mixture composed of $H_2SO_4$, $H_2O_2$ and water.

* * * * *